US 7,076,746 B2

(12) United States Patent
Hamlin et al.

(10) Patent No.: US 7,076,746 B2
(45) Date of Patent: Jul. 11, 2006

(54) METHOD AND APPARATUS FOR MAPPING PLATFORM-BASED DESIGN TO MULTIPLE FOUNDRY PROCESSES

(75) Inventors: Christopher L. Hamlin, Los Gatos, CA (US); James S. Koford, San Jose, CA (US)

(73) Assignee: LSI Logic Corporation, Milpitas, CA (US)

(*) Notice: Subject to any disclaimer, the term of this patent is extended or adjusted under 35 U.S.C. 154(b) by 135 days.

(21) Appl. No.: 10/768,558

(22) Filed: Jan. 29, 2004

(65) Prior Publication Data

US 2005/0034086 A1 Feb. 10, 2005

Related U.S. Application Data

(63) Continuation-in-part of application No. 10/634,634, filed on Aug. 4, 2003.

(51) Int. Cl.
*G06F 17/50* (2006.01)
(52) U.S. Cl. .......................................................... 716/3
(58) Field of Classification Search ..................... 716/3
See application file for complete search history.

(56) References Cited

U.S. PATENT DOCUMENTS

| 5,500,805 | A | | 3/1996 | Lee |
|---|---|---|---|---|
| 5,563,801 | A | | 10/1996 | Lee et al. |
| 5,754,826 | A | * | 5/1998 | Gamal et al. .................. 703/14 |
| 6,102,961 | A | | 8/2000 | Lee et al. |
| 6,219,819 | B1 | | 4/2001 | Vashi et al. |
| 6,625,788 | B1 | | 9/2003 | Vashi et al. |
| 6,757,882 | B1 | | 6/2004 | Chen et al. |
| 6,871,154 | B1 | | 3/2005 | Byrn et al. |
| 2002/0059054 | A1 | | 5/2002 | Bade et al. |
| 2003/0005401 | A1 | | 1/2003 | Shmuel |

OTHER PUBLICATIONS

MOSIS Scalable CMOS (SCMOS) design rules (Revision 8.0) updated Apr. 25, 2003; http://www.mosis.org/technical/designrules/scmos/scmos-main.html; Apr. 30, 2003. pp. 1-14.*

"Layout Compaction Accelerates SoC Design Through Hard IP Reuse," by Coby Zelnik, Senior Vice President, Business Development, Sagantec, Fremont, California, EE Times Dec. 19, 2002 (10:47 a.m. EST); 3 pages; http://www.eetimes.com/story/OEG20021219S0026.

(Continued)

Primary Examiner—Stacy A. Whitmore
(74) Attorney, Agent, or Firm—Suiter West Swantz LLO

(57) ABSTRACT

The present invention is directed to a method and apparatus for mapping platform-based design to multiple foundry processes. According to an exemplary aspect of the present invention, a method for mapping platform-based design to multiple foundry processes may include the following steps. First, a virtual process is defined to include at least one fabrication process. A virtual process is a totality of variables associated with the population of candidate processes and any other process of interest, which might be purely hypothetical, that would be capable, in principle, of accommodating some or all slices. A virtual process may or may not be realized and is an abstract logical container for a population of processes. Then, the virtual process may be stored into a database. The virtual process may be in a representation including a list of attributes of entities making up the fabrication process. Next, optimization of the database may be performed using mathematical and statistical tools.

31 Claims, 4 Drawing Sheets

OTHER PUBLICATIONS

"Layout Compaction in Digital Circuits," by Prof. Kurt Keutzer and A.R. Newton, EECS, University of California, Berkeley, CA; Implication of Deep Submicron, Simplex Solutions; © 1997, A. Richard Newton; 16 pages; www-cad.eecs.berkeley.edu/HomePages/keutzer/classes/ee244fa98/lectures/ee2443_2/ee2443_2.pdf.

"Layout Compaction for Yield Optimization Via Critical Area Minimization," by Youcef Bourai and C.-J. Richard Shi, Electrical Engineering Department, University of Washington, Box 352500, Seattle, Washington 98195; 4 pages; http://jamaica.ee.pitt.edu/Archives/ProceedingArchives/Date/Date2000/papers/2000/date00/pdffiles/02c_4.pdf.

"VLSI Layout Compaction Using Radix Priority Search Trees," by Andrew J. Harrison, Mar. 12, 1991; 5 pages; Http://www.sigda.org/Archives/ProceedingArchives/Dac/Dac91/papers/1991/dac91/41_4/41_4.htm.

"New Algorithms for Minimizing the Longest Wire Length During Circuit Compaction," by Susanne E. Hambrusch, Department of Computer Sciences, Purdue University, West Lafayette, IN 47907 and Hung-Yi Tu, Department of Computer Science and Information Management, Providence University, Taichung, Taiwan, ROC; Jan. 26, 1995; 33 pages; http://www.cs.purdue.edu/homes/seh/papers/longjour.pdf.

"A Graph Based Simplex Method for the Integer Compaction Problem," by Alexey Lvov and Fook-Luen Heng, IBM Research; 1 page; http://researchweb.watson.ibm.com/compsci/algorithms/seminar.html.

"Layout Synthesis Techniques for Yield Enhancement," by Venkat K.R. Chiluvuri and Israel Koren, Department of Electrical and Computer Engineering, University of Massachusetts, Amherst, MA 01003; 21 pages; http://citeseer.ist.psu.edu/cachedpage/90278/1. Originally published in *IEEE Trans. on Semiconductor Manufacturing*, vol. 8, Special Issue on Defect, Fault, and Yield Modeling, pp. 178-187, May 1995.

* cited by examiner

METHOD AND APPARATUS FOR MAPPING PLATFORM-BASED DESIGN TO MULTIPLE FOUNDRY PROCESSES

CROSS REFERENCE TO RELATED APPLICATIONS

The present application is a continuation-in-part of U.S. patent application Ser. No. 10/634,634, entitled "Method and Apparatus for Mapping Platform-Based Design to Multiple Foundry Processes," filed Aug. 4, 2003, now pending. Said U.S. patent application Ser. No. 10/634,634 is herein incorporated by reference in its entirety.

FIELD OF THE INVENTION

This invention relates generally to integrated circuits, and particularly to a method and apparatus for mapping platform-based design to multiple foundry processes.

BACKGROUND OF THE INVENTION

Foundry mapping is a process of mapping an IC (integrated circuit) design onto a fabrication process used in a foundry. Different foundries conventionally have different fabrication processes and design rules. Being able to readily map an IC definition onto different fabrication processes is a long sought-after goal in the IC industry. However, this goal tended to be very difficult in standard cell architecture because the emphasis has been on extracting the maximum possible performance out of any particular process. For example, the actual libraries that define the cell characteristics are often pressing the corner cases of the process, and only when a device specified does not work (because timing is not met or because there is leakage or for some other reasons) does the IC designer adjust the process/design until the IC designer squeezes the IC design into the product parameters that are operable. Because the problem of readily mapping an IC definition onto different fabrication processes was insufficiently constrained (too many variables) in standard cell architecture, the problem proved to be intractable computationally.

MOSIS (Metal-Oxide Semiconductor Implementation Service) takes a very high-level abstract specification of an IC, circuit characteristics and parameters, and maps the IC onto any of several existing processes. For example, MOSIS may map an IC to any of a number of foundry processes. Indeed, MOSIS may even allow an IC to be mapped to foundry processes of different generations including a 0.25 micrometer process, a 0.18 micrometer process, a 0.13 micrometer process, and the like.

The reason that MOSIS renders the problem of readily mapping an IC definition onto different fabrication processes computationally tractable is that MOSIS detunes the performance and density characteristics of the mapping. However, the extent of the detuning is such that MOSIS does not produce the degree of performance optimality or packing density optimality required in a commercial design. In other words, MOSIS mapping is mostly used for academic proof-of-concept, not for commercially viable products.

Thus, it would be desirable to provide a method and apparatus for readily mapping commercially viable IC design (e.g., platform-based design) to multiple foundry processes.

SUMMARY OF THE INVENTION

Accordingly, the present invention is directed to a method and apparatus for mapping platform-based design to multiple foundry processes. According to an exemplary aspect of the present invention, a method for mapping platform-based design to multiple foundry processes may include the following steps. First, a virtual process is defined to include at least one fabrication process. A virtual process is a totality of variables associated with the population of candidate processes and any other process of interest, which might be purely hypothetical, that would be capable, in principle, of accommodating some or all slices. A virtual process may or may not be realized and is an abstract logical container for a population of processes. Then, the virtual process may be stored into a database. The virtual process may be in a representation including a list of attributes of entities making up the fabrication process. Next, optimization of the database may be performed using mathematical and statistical tools.

According to an additional exemplary aspect of the present invention, a method for mapping platform-based design to multiple foundry processes may include the following steps. First, a first slice is optimized to a first foundry process including a first late metal step. Then, a second slice is optimized to a second foundry process including a second late metal step. The first late metal step and the second late metal step may share a functional, geometrical and electrical interface. This way, the first slice, after being implemented in the first foundry process, may be readily implemented in the second foundry process for the late metal step (or metallization), and the second slice, after being implemented in the second foundry process, may be readily implemented in the first foundry process for the late metal step (or metallization).

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
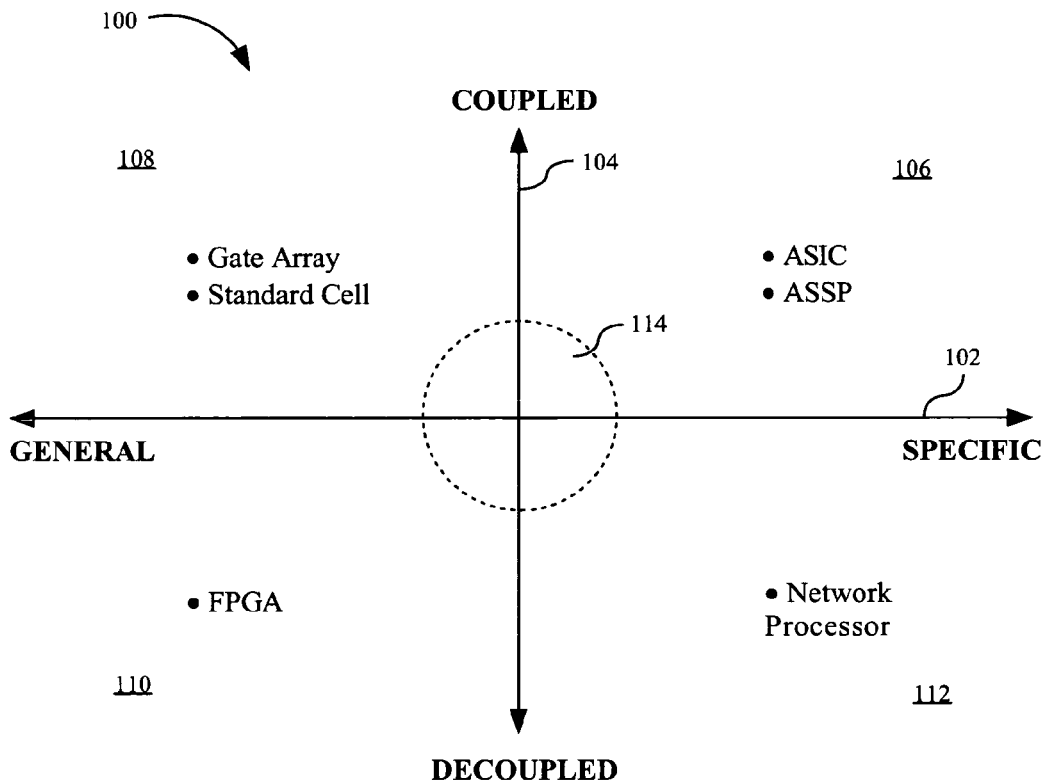
FIG. 1 is a schematic diagram illustrating an exemplary two-dimension space in which a semiconductor device may be positioned.

FIG. 1 is a schematic diagram illustrating a two-dimensional space 100 in which a semiconductor device may be positioned. The space 100 may include a horizontal axis 102, a vertical axis 104, and four quadrants 106, 108, 110 and 112. Using the horizontal axis 102, a distinction may be made between a semiconductor device which is general in its application and another semiconductor device which is specific in its application. Using the vertical axis 104, a distinction may be made between a semiconductor device whose final functionality is coupled to a manufacturing process and another semiconductor device whose final functionality is decoupled to (i.e., independent of) a manufacturing process, using some form of programmability.

An FPGA (field programmable gate array) is an example of a decoupled device that is very general in nature. An FPGA is manufactured in high volumes in a factory without any consideration at all of its ultimate actual functional purpose. Thus, the manufacturing and the functionality are completely independent of each other, i.e., completely decoupled. An FPGA may be positioned in the quadrant 110.

On the other extreme, an ASIC (application specific integrated circuit) or an ASSP (application specific standard product) is an example of a coupled device that is very specific in nature. An ASIC or an ASSP is completely coupled because the device does not have existence until the actual design that the ultimate customer intends for the device to have is imposed on the device, which is accomplished in the factory. An ASIC or an ASSP is also very specific with respect to the functionality. An ASIC or an ASSP may be positioned in the quadrant 106.

Gate array or standard cell devices are suitable for a very general range of applications and are also very tightly coupled, and may be positioned in the quadrant 108. A network processor has very specific application but is fully decoupled and may be positioned in the quadrant 112.

A platform may be positioned within a center area 114 of the space 100. A platform is a large-scale, high-complexity semiconductor device that includes one or more of the following elements: (1) memory; (2) a customizable array of transistors; (3) an IP (intellectual property) block; (4) a processor, e.g., an ESP (embedded standard product); (5) an embedded programmable logic block; and (6) interconnect. RapidChip™ developed by LSI Logic Corp. is an instance of a platform.

Platform-based IC (integrated circuit) design is a powerful concept for coping with the increased pressure on time-to-market, design and manufacturing costs. The basic idea behind the platform-based design is to avoid designing and manufacturing a chip from scratch. Some portion of the chip's architecture is predefined for a specific type of application. Through extensive design reuse, the platform-based design may provide faster time-to-market and reduce design cost.

Under a platform approach, there are two distinct steps entailed in creating a final end-user product: a prefabrication step and a customization step. In a prefabrication step, a slice is built on a wafer. A slice is a pre-manufactured chip in which all silicon layers have been built, leaving the metal layers or top metal layers to be completed with the customer's unique IP. For example, RapidSlice™ developed by LSI Logic Corp. is an instance of a slice. One or more slices may be built on a single wafer. It is understood that a slice may include one or more bottom metal layers or may include no metal layers at all. In a preferred embodiment of the prefabrication step, portions of the metal layers are pre-specified to implement the pre-defined blocks of the platform and the diffusion processes are carried out in a wafer fab. That is, the base characteristics, in terms of the IP, the processors, the memory, the interconnect, the programmable logic and the customizable transistor array, are all pre-placed in the design and pre-diffused in the slice. However, a slice is still fully decoupled because the customer has not yet introduced the function into the slice. In a customization step, the customer-designed function is merged with the pre-defined blocks and the metal layers (or late-metal components) are laid down, which wire up the elements that make up the slice built in the wafer fab early on, and the customizable transistor array is configured and given its characteristic function. In other embodiments, early-metal steps may be part of the pre-fabricated slice to reduce the time and cost of the customization step, resulting in a platform which is more coupled and specific.

It is understood that a prefabrication step and a customization step may be performed in different foundries. For example, a slice may be manufactured in one foundry. Later, in a customization step, the slice may be pulled from inventory and metalized, which gives the slice its final product characteristics in a different foundry.

Figure 2:
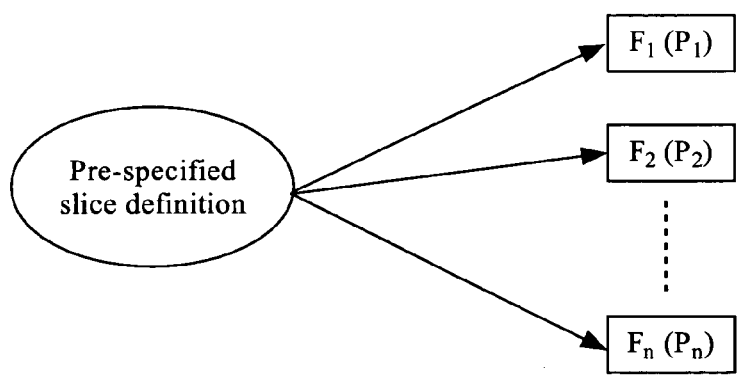
FIG. 2 is a schematic diagram illustrating a pre-specified slice definition may be readily mapped in different foundries which run different fabrication processes in accordance with the present invention.

Given the foregoing-described slice definition, from a commercial point of view, it is very important to be able to assure multiple sources of supply for a slice. Referring to FIG. 2, there may be multiple different foundries $F_1, F_2, \ldots, F_n$, which run fabrication processes $P_1, P_2, \ldots, P_n$, respectively. It is desirable to take a pre-specified slice definition (which is a logical and functional specification of all of the operational characteristics of the slice, including the IP that makes it up, the interconnect, the behavior of the interconnect, the memory cell, the timing, all of the verification details that apply to the slice itself, and the like) and be able to swing it readily among these different foundries $F_1, F_2, \ldots, F_n$.

A slice is a constrained specification. A slice is an abstract specification of all IP, characteristics of interconnect, memory structures, I/O's, a transistor array, embedded programmable logic (if there is any), and the like. All these elements are pre-specified before any functional exploitation of the resources on the slice is commenced. The fact that a slice is a constrained environment suggests that the problem of readily mapping a pre-specified slice definition onto different fabrication processes may be computationally tractable. That is, it may be possible to take the slice definition, irrespective of what the slice ultimately will be used for in a final product, and apply the slice definition to any of several alternative fabrication processes, possibly from alternative foundries (the sources of supply for the slice).

Figure 3:
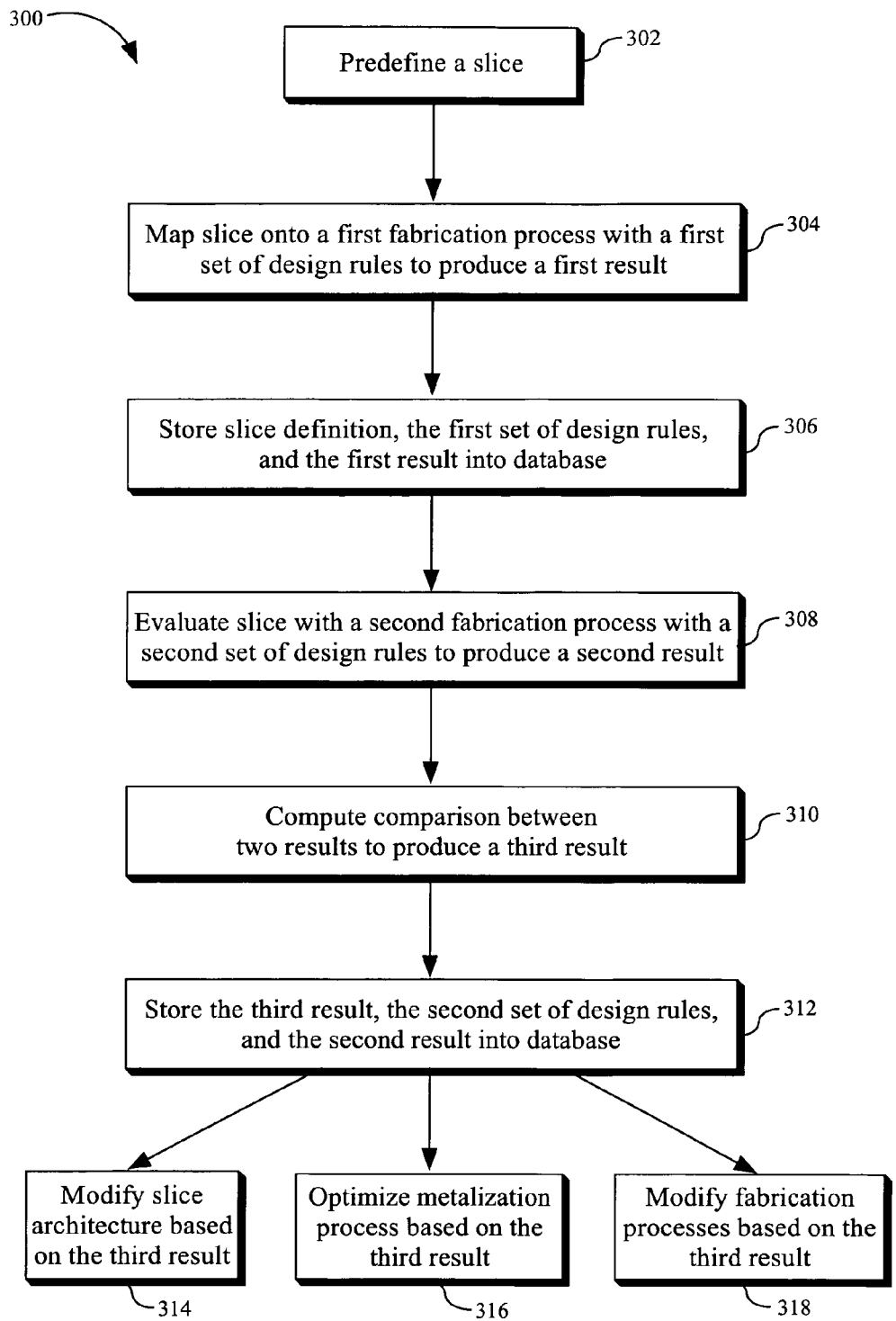
FIG. 3 is a flow diagram showing an exemplary process for readily mapping a slice definition onto multiple fabrication processes in accordance with the present invention.

FIG. 3 is a flow diagram showing an exemplary process 300 for readily mapping a slice definition onto multiple fabrication processes in accordance with the present invention. The process 300 starts with step 302 in which a slice may be predefined (or prespecified). In other words, a definition (or specification) may be provided for a slice. Then in step 304, the pre-defined slice is mapped onto a first fabrication process with a first set of design rules to produce a first result. In a preferred embodiment, the predefined slice is successfully verified within the context of the first set of design rules of the first fabrication process. In other words, the mapping to the first fabrication process is successful.

Next, in step 306, the definition of the predefined slice, the first set of design rules, and the first result may be stored into a database. That is, the limit condition or the boundaries for the slice mapping or implementation may be analyzed, and all of the operational characteristics (including the jitter, the timing, the logical characteristics, the latency, the tolerable latency, the power characteristics, the analog properties, leakage, IR drop, and the like) may be stored into a database. In other words, all fundamental entities that describe whether or not the predefined slice is correctly implemented within the boundary of the first fabrication process are abstracted and recorded parametrically in a database. It is understood that the step 306 may be alternatively not included in the process 300 without departing from the scope and spirit of the present invention.

Next, in step 308, the pre-defined slice may be mapped onto a second (target) fabrication process with a second set of design rules to produce a second result. That is, the pre-defined slice, which has been successfully verified within the first set of design rules and successfully mapped, is evaluated with respect to the slice's ability to be implemented in a second fabrication process with a second set of design rules. In a preferred embodiment, the second fabrication process is fairly close to the first fabrication process, e.g., they both use 0.13-micron technology, they both use 0.18-micron technology, or the like.

Then, in step 310, a comparison between the first and second results may be computed to produce a third result. According to one aspect of the present invention, computation of comparison may be accomplished with a hybrid analysis, wherein evaluation of an element of the slice is discontinued when the element is established to be useable in the second fabrication process. It is understood that from the standpoint of a system implementing the comparison, if one were to analyze at the analog level every single transistor in every single element making up a slice, the problem is intractable from a computational point of view. In other words, it would take such enormous amount of time to compute the comparison that one might just as well perform conventional mapping, which is manual and typically takes 18 to 24 months to complete.

However, a predefined slice is a constrained environment, i.e., a predefined slice is composed of a limited number of types of elements or blocks, each with a rigidly specified set of functional and performance characteristics. Thus, it is not necessary to carry out a full, in-depth analysis of every single transistor. In fact, the great bulk of logical function that are encapsulated in the libraries, the cell structures, the interconnect definitions, the elements of the slice, and the like may be certified valid for comparison purposes in the second fabrication process, without descending all the way to the deepest level of analog analysis, e.g., the SPICE (simulation program with integrated circuits emphasis) analysis and the like.

According to an exemplary aspect of the present invention, the step 310 may be a tree-structured analysis, in which only a small number of the analytical steps may be needed to descend, for example, to the deepest level of SPICE as the analysis proceeds, i.e., as the effectiveness of the second fabrication process is established for particular classes of element. It is understood that this does not just mean elements in isolation, but it is potentially a combinatorial problem. However, the performance constraints of the elements of the pre-defined slice may limit the propagation of potential differences and may allow analysis to be localized. As this tree of device effectiveness is built up, that, too, is stored in the database so that the database accumulates intermediate analytical results, which may be used to guide subsequent steps in the assessment of the conformance of the second fabrication process to support the predefined slice.

It is understood that the step 310 may be an extremely computationally intense activity. According to one aspect of the present invention, one may exploit the price performance characteristics of systems with inexpensive hardware and software to come on the market in the last two or three years, particularly those using Intel-compatible processors and Linux operating systems, to build network-distributed processing systems, which may possess enormous computational power to solve this computation problem for far less money than was true even five years ago.

Next, in step 312, the comparison results and the second set of design rules may be stored into the database. In a preferred embodiment, the steps 310 and 312 are a joint combination of the infrastructure analysis to get the maximal advantage out of price performance that the market offers today (as opposed to spending millions and millions of dollars on a super computer, which is how one would have done it 5 or 10 years ago), the structure of the database (which preferably records both the input parameters of the problem and accumulates the intermediate results as the analysis progresses forward), and the hybrid analysis (i.e., one discontinues evaluation of a particular design element once one has established that the element, as fused in the slice, is usable in the second fabrication process). In a preferred embodiment, the database may include a first field containing data representing the slice definition, a second field containing data representing the first set of design rules, a third field containing data representing the second set of design rules, a fourth field containing data representing the computed comparison result (including intermediate and preliminary results), and so on. According to one aspect of the present invention, the computed comparison result (the third result) may contain some variables that are invariant in platform-based design, which may be used to predict the mapping to a new foundry. With such a database established, new platform-based designs may be mapped to existing foundries, and existing platform-based designs may be mapped to new foundries within a time interval (e.g., hours) much shorter than the 18 months that typical manual mapping takes. Even better, one may reconstruct a new mapping for a new foundry or product, based on heuristics learned from prior mappings between prior platform-based designs and existing foundries. This is useful when moving from one foundry to another using the same platform-based design.

Once the ratification of the second fabrication process has been achieved, or once preliminary results (e.g., the third result) obtained from a comparison of the two processes for the slice have been stored into the database, these preliminary results may then be applied in a number of different ways. In one embodiment of the present invention, as shown in step 314, these preliminary results may be fed back into the definition of the slice itself so that the architecture of the slice is modified to make it fit better within the space of the two sets of design rules that have now been incorporated into the database. It is not absolutely necessary that the slice implementation in the two processes be identical, as long as the interface to the upper layers of metal is functionally identical and the parameters of that interface lie within defined tolerances. The tolerances are defined by the requirements of the late-metal process used in the customization step. Thus, there is some room in the plan for optimization of inventoried slice wafers for the process used to fabricate them.

In a further embodiment of the present invention, as shown in step 316, these preliminary results may carry implications for how the metalization (or later-metal process) is optimally accomplished. In other words, these preliminary results may have an impact on the process steps that apply to the metalization (or late-metal definition). This is very important because increasingly in the future the metal (or late-metal) steps may be the critical steps in determining the efficiency, the profitability and the cost effectiveness of the entire platform (e.g., RapidChip™) oriented process.

In another embodiment of the present invention, as shown in step 318, these preliminary results may apply to the fabrication process itself (e.g., the diffusion processes in the wafer fab). Initially, one may accept the design rules that the foundry provides without making any attempt to modifying them. However, as one gains more and more experience with this process of foundry targeting and foundry mapping, it is clear that one may derive a huge database on the effectiveness of particular process properties and process characteristics for the implementation of particular slices. The preliminary results may then be fed back into the definition of the fabrication process itself. As one gains volume and clout in the marketplace with the platform approach, one's ability to influence foundries may be enhanced by this ability to apply what one has learned to their processes; this minimizes the need for foundry-specific optimizations. Just like FPGAs that represent a very high proportion of the foundry volume today and are thus able to influence process definition within the foundries, the platform-based design may have the same effect, which is very important in enhancing value and in increasing profitability.

Thus, the preliminary results of the comparison may be fed back into the slice definition itself, into the metalization (or late-metal) steps, and/or into the wafer fab processes (e.g., the diffusion processes).

It is understood that the process 300 is exemplary only. Those of ordinary skill in the art will appreciate that other embodiments may be used without departing from the scope and spirit of the present invention. For example, the steps 306 and 312 shown in FIG. 3 may be merged into a single step in which the slice definition, the first set of design rules, the second set of design rules, the first mapping result, the second mapping result, and/or the comparison result are stored into a database. Alternatively, the process 300 may include neither the step 306 nor the step 312.

According to a further aspect of the present invention, the manufacturing infrastructure, which is implied by this whole system of analysis and attempt to take slices (abstract slices that do not have any function in and of themselves) and evaluate them in the light of different fabrication processes and so on, may have an impact on platform architecture itself. After repeating the process 300 shown in FIG. 3 to many different slices, one may gain insight on the entire architecture of how to organize a platform. For example, one may learn the answer to the following operations research question: how best should one organize the resources that are distributed on a particular platform, both spatially and temporally? The analysis derived from the computed comparison and the process of fitting slices and fabrication processes together may result in an understanding of the limits to temporal optimization that seem to be imposed on these platform devices, which particularly takes the form of the temporal structure of the interconnect (hierarchical or not hierarchical).

According to one aspect of the present invention, both the spatial structure and the temporal structure of the organization of platforms may be best understood or optimized in terms of broken symmetry, which is a general property of systems and structures in nature that is widely and deeply studied in evolutionary theory. The preliminary results obtained from studying how to target different foundries and different processes with our individual slices may be applied to the definition of the platform itself and may allow one to effectively apply broken symmetry to both the temporal and the spatial structures that one may incorporate in future platform architectures.

One objective of the present invention is to be able to automate the process of migrating from one foundry process to another foundry process (i.e., to accomplish platform portability) on the assumption that the differences between the processes are sufficiently small that they can be navigated. The problems entailed in accomplishing platform portability may include problems with timing closure, which is one of the most serious, and problems having to do with whether or not the specification for the slice can be met to the customer's satisfaction with respect to its electrical and electronic properties, which may be governed in part by things such as leakage, conductance, various forms of noise (including 1/F noise), electromigration, and the like.

To accomplish the foregoing-described objective, from a commercial point of view, one may ask a series of distinct questions. Question 1 is as follows: Given that a slice (e.g., Slice 1, or the like) has successfully been implemented and fully verified in a first process (e.g., Process A), can the slice, with equal success, be implemented and verified and characterized in a second process (e.g., Process B)? Here, equal success may mean meeting all electrical parameters that are legal in the definition of the constraints under which the user of the slice operates, or mean that the slice is completely usable in terms of customer utilization and the resources on the slice, or mean yield.

Question 2 may take the following form: Given that the answer to Question 1 is yes, in some sense, what are the bounding properties of slices in Process B compared to Process A? In other words, now instead of taking a single slice, one may ask the following question: From a distribution point of view (e.g., from the standpoint of a Gaussian distribution of slice characteristics—and obviously, this may be a space with thousands of dimensions with an enormously complex distribution of attributes and characteristics), what are the defining properties of all of the slices that one might be interested in migrating from Process A to Process B? Obviously, one may take each individual slice in Process A and ask of it: What is the answer to Question 1? For each slice, one may get a yes or no answer. However, Question 2 extends that further and asks: What are the properties (the distribution properties) of a population of slices? Thus, Questions 2 concerns a slice population.

The problem in fitting or mapping one space into another may be set up in at least two different ways. First, the problem may be set up in a multidimensional space (slice space) whose dimensions are the variables or attributes of all of the slices. In a slice space, each candidate process is a point, theoretically, lying within the space defined by those dimensions. The process point lies either within or outside of the embrace of the legally valid values of the variables or attributes. Second, the problem may be set up in a multidimensional space (process space) whose dimensions are the parameters of the processes, and each slice is a point in the process space. Obviously, these two representations are equivalent in some sense. The problem may be set up in such a way that it may be represented at will either using a process space or a slice space from a systems point of view. It is understood that a process here may be the whole fabrication process, just the diffusion step (i.e., prefabrication step), or just the late metal step (i.e., customization step). It is understood that the meaning of the late metal step is not limited to its literal meaning. For example, for a slice including no metal at all, in the late metal step, all metal layers (not just upper metal layers) will be laid down. The process may be defined in terms of design rules, or may be defined at a deeper level that takes account of things like leakage and inductance and electromigration and the like.

According to the present invention, a principle for accomplishing platform portability may be given as follows. One may assume that a design has been implemented in Process A and is operating correctly and meeting customer specifications. Now it is proposed to implement the design in Process B, which is a new process with a different set of design rules and a different feasible set from those of Process B. If the design is to operate properly and meet specifications in Processes A and B, its design parameters must lie within the feasible sets of both Process A and Process B. In other words, if all feasible designs implemented under a given original process are to operate properly under a new process, the feasible set for the original process must be completely contained within the feasible set for the new process. A feasible set is a set of design parameters for a feasible design. Thus, any design with parameters in the feasible set is a feasible design.

Figure 4:
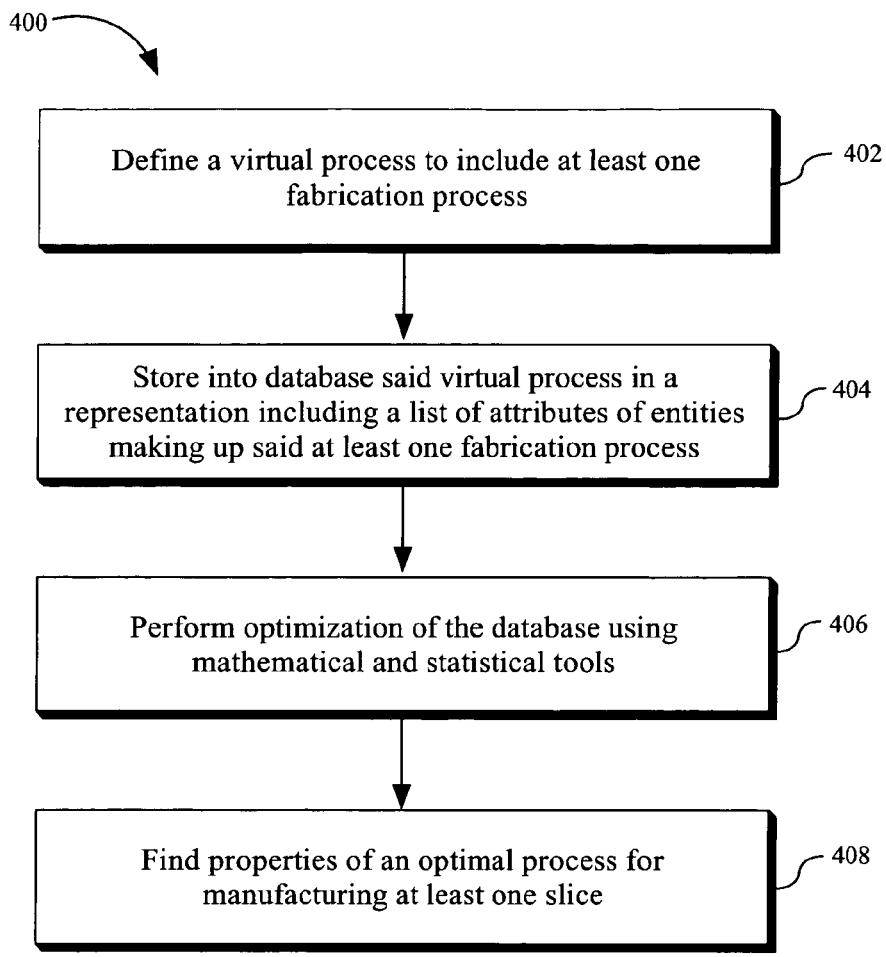
FIG. 4 is a flow diagram showing an exemplary process for mapping platform-based design to multiple foundry processes in accordance with the present invention.

Referring now to FIG. 4, a flow diagram showing an exemplary process 400 for mapping platform-based design to multiple foundry processes in accordance with the present invention is shown. The process 400 may start with a step 402 in which a virtual process is defined. A virtual process is a totality of variables associated with the population of candidate processes and any other process of interest, which might be purely hypothetical, that would be capable, in principle, of accommodating some or all slices. A virtual process may or may not be realized and is an abstract logical container for a population of processes. The characteristics of the virtual process may be dictated from the slices down. In other words, one may want to find a virtual process, whether it exists or not, which might, in principle, be capable of accommodating an entire population of slices, or one may want to define a virtual process which represents the union of all processes, plus some other features, and then to ask whether that virtual process is capable of accommodating one or more populations of slices. With the virtual process so defined, it may not matter whether one uses a process space or a slice space, except for matters of efficiency and precision, which may be a function of the particular formal method that one is using.

Next, the virtual process may be stored into a database 404. Preferably, the virtual process may exist in a representation including a list of all of the variables or attributes of the entities making up the process or set of processes. The list may include the design rules, the physical parameters, and anything else that one is interested in (e.g., temperature ranges, thicknesses, viscosities, and the like).

Then, optimization of the database may be performed using mathematical and statistical tools 406. The optimization may be based on analysis that goes all the way down to the analog level, as far as the slice is concerned. In other words, for the mixed signal, analog functions, PLLs (phase-locked loops), DACs (digital to analog converters), ADCs (analog to digital converters), or whatever analog function one is interested in, one may go all the way down to the most excruciatingly low level of detail in terms of the analog behavior of the thing, in which case one may use the output of SPICE models as one of the comparison tools in the most extreme case.

Of course, to perform the optimization, one may first compute SPICE models of every single element of every single slice and then ask, of every single element and its interactions with all of the possible elements that it might have occasion to interact with, whether the element and all of its interactions fall within the characteristics of a candidate process. However, such a method may be intractable and impractical.

In a preferred embodiment, to optimize the database, one may use the detailed timing characteristics, which are well known, for each of the elements in any given slice or a population of slices. Thus, things like jitter, setup and hold times, margins, noise/signal ratio, all kinds of temporal qualities and temporal properties, the fundamental electrical properties expressed in terms of current, voltage and resistance, IR characteristics, power, temperature, energy characteristics, performance and the like, may be generalized and expressed very precisely parametrically within the database, defining the slices and the processes. They may be set up as thousands of linear equalities and linear inequalities. In other words, a system of linear equalities and linear inequalities may be used to describe operational characteristics and interactions of each circuit element, in terms of the element's necessity either not to exceed or not to fall below some criterion or to fall within some range of criterion, and to then test the entire ensemble with respect to its adherence to these margins. The system of linear equalities and linear inequalities may then be evaluated as a linear programming problem. Linear programming, also know as operations research, is the problem of maximizing a linear function over a convex polyhedron. Linear programming may be solved using the simplex method which runs along polytope edges of the visualization solid to find the best answer, Khachian's algorithm, or a more efficient Karmarkar's algorithm which goes through the middle of the solid and then transforms and warps.

Basically, there may exist a lot of techniques for evaluating systems of equations expressing inequalities in spaces of this kind. For example, the constraint and objective functions need not be linear; if they are curved, but still convex, mathematical optimization is still possible. The present invention may select a set of methodologies for efficiently judging and optimizing the position of the slice within the process space and/or the position of the process within the slice space. Due to the geometry of convex constraints and the convex functions, a linear programming problem may also be convex. Thus, for optimization problems, which may be strictly linear (linear programming problems) or may not be strictly linear but still convex, there are no local optima (aside from the global optimum). In a preferred embodiment, convex optimization may be used to solve the linear programming problem. The general method of convex optimization is to find the minimum of a convex (or quasiconvex) function on a finite-dimensional convex body. Convex optimization also makes uses of a particular mathematical formulation called posinomials, which are polynomials whose exponents are positive. Those of ordinary skill in the art will understand that methods used in convex optimization may include Levin's algorithm, the Nemirovsky-Yudin-Shor method (i.e., the method of circumscribed ellipsoids), a descent method, a barrier method, a cutting-plane method, and the like. The application of convex optimization techniques may greatly improve the quality of the results as well as the efficiency of the present method.

In practice, it is often difficult to tell on inspection whether a problem is in fact convex, and if it is not convex, then the method of convex optimization may fail. However, a problem may be recast in a convex form even though the problem may appear in a non-convex form. A change of variable can be very effective in recasting a non-convex problem in the convex form. The present system of setting up the slices, the processes and the spaces, which are referred to as a virtual definition, may allow one to accomplish this recasting of the problem space. Moreover, even if the totality of a problem is not convex, the problem may be decomposed to include a combination of smaller sub-problems which are convex, plus one sub-problem which is not convex (thus, this sub-problem may require manual input). One may then use convex optimization to treat these convex sub-problems.

Still referring to FIG. 4, in a step 408, properties of an optimal process for manufacturing at least one slice may be found. After a slice population (or a slice) have been described through a set of the foregoing-described distributions and have been well characterized and verified in one or more processes, it might be highly beneficial to ask the Question 3: What would be the properties of an optimal process that one would wish to define for, for example, a foundry that one proposed to enter into an agreement with for the purpose of manufacturing this population of slices and any others that are accommodated within the definition of the population? In this case, one may ask the present system to go through all of the attributes of the entities associated with the slice design definitions and abstract from them the characteristics of the process, which may in turn be compared to the previously existing processes and may be subjected to refinement or extension or enhancement or for improved yield, and so on and so forth. In other words, the present system may be operated so that one may be able to describe the characteristics of a very efficient process that may accommodate the population of slices or may be amenable to accommodating an extension of the population of slices in a particular direction (e.g., improved yield, very low power consumption, very high performance, very low cost, and the like). For example, if one would like to be able to take the population of slices and define a new process that would accommodate implementation of the population of slices in a much lower power mode of operation, then one may work with a partner to implement that improved process that would efficiently manufacture the population of slices suitable for very low power operation.

In an alternative embodiment of the step 408, one may run the design properties for a particular set of slices or a particular slice into the database and allow the various levels of comparison to take place between the slice and process spaces. The virtue of doing this is that it frees one from the necessity to load in separately and individually every single process or to even have a definition for the process of interest to verify the design.

It is understood that the method 400 shown in FIG. 4 may explicitly separate the late metal step (i.e., customization step) from the diffusion step (i.e., prefabrication step) in a fabrication process. There are two reasons for doing this. One is associated with mask set costs, which in a case of the 90-nanometer process may run into the millions of dollars. Thus, one objective of the present invention is to be able to hold constant and to minimize mask set costs so as to reduce the risk, even as one increases the flexibility and the malleability of the product as defined in the late metal steps. Managing mask set costs and accommodation of small runs are two very important objectives of the present invention. The other reason is that one need to be free to run the diffusion step in one foundry and the late metal step in another foundry. One may wish to be in a position to specify the suitability of just this diffusion part of the process for accommodating the population of slices that one is interested in, and, independently of this diffusion step, to know that one has another definition of the late metal step that may be applied to another foundry for doing the late metal step, knowing that if the diffusion step is working properly, the late metal step is guaranteed to do so. The reason that the virtual process definition is so important is that there are many interactions that take place, both logically and electrically, between the structures that are defined at these two levels (the diffusion step and the late metal step). Thus, one may need to have a logical facility that comprehends the definition and the limits of the structures at both of these levels and is able to reconcile them with each other and specify when and under what circumstances they may work correctly without necessarily telling the foundries working at these two different levels what those characteristics are. One may not want the foundries to even have any idea where one is doing these steps. In other words, one may want to be able to treat inventory as a completely abstracted virtualized process, which requires that one to have control of the metal stack at the low levels as well as the diffusion from a process definition point of view. In effect, what one is doing is creating a second level of virtualization. This second level of virtualization links the design environment (i.e., the design world that the designer or the end-user facility is operating in) with an abstracted world in which the slices themselves are manufactured. This is very important both in order to contain mask set costs and to make it possible to implement techniques for accommodating small runs. Thus, one may do very high-margin, low-volume products and, in particular, one may run these things independently in completely different foundries, without having to have the foundries be in any kind of communication with one another at all.

Figure 5:
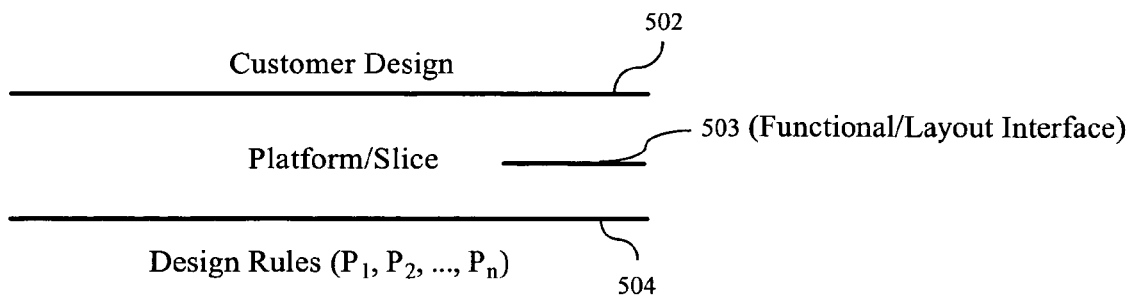
FIG. 5 is a schematic diagram illustrating two exemplary virtual interfaces, in terms of which platform portability may be undertaken, in accordance with the present invention.

FIG. 5 shows a schematic diagram illustrating two exemplary virtual interfaces 502 and 504, in terms of which platform portability may be undertaken, in accordance with the present invention. The virtual interfaces 502 may be an instantiation layer where a customer design is implemented on a particular platform or slice. The virtual interface 502 may entail multiple metal steps, which may be implemented in different facilities with different capabilities and process parameters. The virtual interface 504 may be defined between the design rules for a particular process and a platform or slice. The present invention applies to both the virtual interface 502 and the virtual interface 504. According to the present invention, multiple slices and populations of slices may become potential objects of portability. In addition, one may virtualize the relationship between the slice definition and the design rules applying to Process 1, Process 2, and the like so that one may vary the choice of process while holding slice definitions invariant, and one may hold invariant the customer design and vary the instantiation in light of the process steps. Moreover, it is perfectly practical (though somewhat more complicated) to have a different low-level implementation of the same slice for each process, as long as the virtual functional/layout interface 503 (see FIG. 5) is the same with specified tolerances. Such process-specific slice implementations may extend the "range" of processes that may be used with platform portability. In the present invention, only the virtual interface (not necessarily all layers) need be identical between two processes.

The platform portability is now described from the point of view of looking at design rules and how things happen at the detailed level from a practical point of view.

Figure 6:
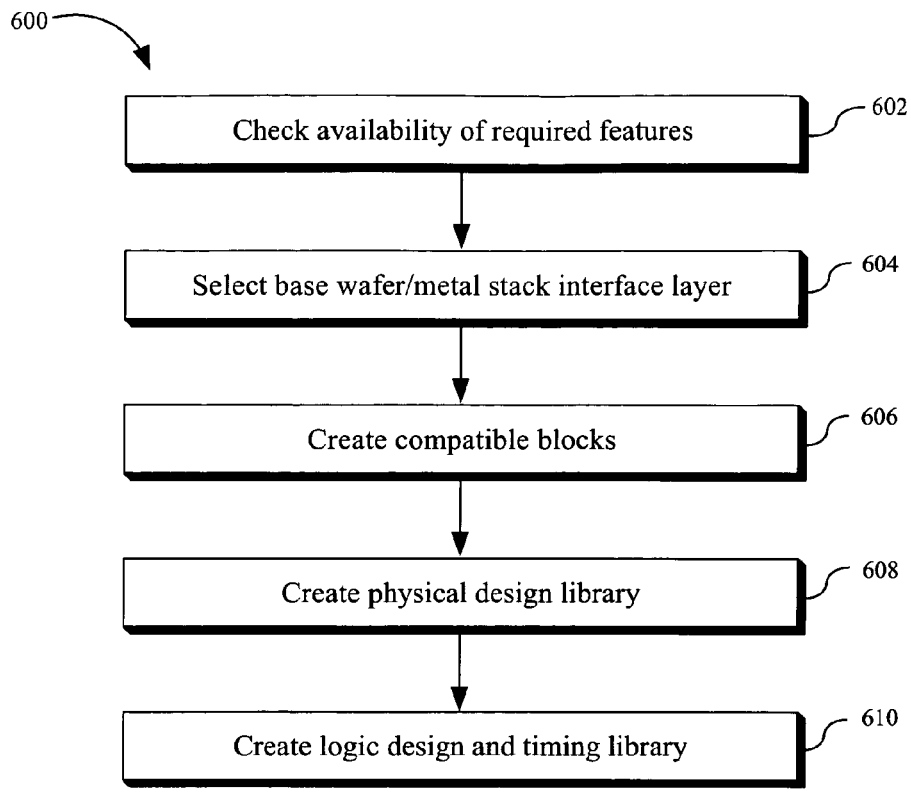
FIG. 6 is a flow diagram showing an exemplary method for targeting multiple foundry processes in accordance with the present invention.

Referring to FIG. 6, a flow diagram showing an exemplary method or process 600 for targeting multiple foundry processes in accordance with the present invention is shown. The method 600 may be applied to migrating an IC design from a foundry process to another foundry process, where the foundry processes have the same late metal step (thus a single metal stack) but different diffusion steps (thus more than one base wafer processes). However, it is understood that the method 600 may be applied to other foundry processes as may be contemplated by those of ordinary skill in the art without departing from the scope and spirit of the present invention. The process 600 may start with a step 602 in which availability of required features may be checked. The target foundry process must provide all the features that are used in a particular design. LSI Logic's G12™ process technology may be used as an example. The G12™ process design rules specify 21 metal stack structures and options, 10 transistor types, 5 analog resistor types, optional Zener breakdown element, optional CAPPLATE layer, optional Cap(n) device, optional vertical PNP device, and the like. Thus, if a design uses a particular one of the structures and features specified by the G12™ process design rules, the feature must be in the candidate or target foundry process. Therefore, there may exist a long list of required features to check before one may go any further.

One may also need to check constraints on the foundry process. The constraints may include the following categories: (1) topological constraints; (2) process and reliability constraints; and (3) performance and electrical constraints. Under the topological constraints category, one may need to consider the following: (a) width and spacing (for the base wafer, there are N-wells and P-wells, islands, and poly_layers, and each of these has constraints with respect to one another, in terms of both width and spacing; for the metal stack, there are interconnect, contact, metal and via layers, and there are constraints between these different layers, in terms of both width and spacing); (b) SRAM rules (the ultrahigh density rules, which are used for SRAMs to get high performance and/or high density. As a result, the foregoing mentioned design may be pushed a little bit in very controlled geometries so that one may get the different performance but still have reasonable yield); (c) pads and packaging rules (which have their own characteristics, which in some cases may violate some of the rules that one would like to see for width and spacing of the more general circuit); (d) ESD (electrostatic discharge)/latch-up special rules (these may come into play for the chip I/Os and look at issues like avoiding high field strengths between different structures that might be a result of ESD); and (e) porting issues (the routing of metal layers may constrain locations of connection to the base wafer. However, differences in base wafer design rules may require differences in the locations of base wafer structures. Thus, one may potentially change a structure to make it compatible with the different base wafer processes.)

Under the process and reliability constraints category, one may need to consider the following: (a) thick oxide transistors minimum gate length versus $V_{ds}$ (these rules cannot be checked by standard DRC software); (b) antenna rule; (c) metal coverage (to use metal, typically between 25 percent and 74 to 75 percent of the die need be covered); (d) slotted metal (most wide-metal structures have to be slotted. For pads, metal may not be slotted; however, for others metal needs to be slotted); and (e) electromigration (which looks at the current density).

The performance and electrical constraints category, one may need to consider the following: (a) sea-of-transistors are all identical (under a sea-of-transistors approach, one cannot adjust transistor sizes on individual cells; however, there are many fewer variables to deal with in the optimization); (b) timing (including setup/hold time and skew. Implicitly, the function of the circuit need be independent of the expected timing variations); (c) power consumption (typically, there is an upper bound on what the system application can tolerate); (d) IR drop (need to make sure that the transistors in the center of the chip work when the functions are switching); (e) I/Os (including drive strengths, switching thresholds, switching speed, and delays. Here again, the chip characteristics are visible to the external system); and (f) analog performance (if there are analog blocks, the analog performance in terms of noise, gain and the like need be within a certain range).

Next, a base wafer/metal stack interface layer may be selected 604. This interface layer is where different foundry processes are connected. If one desires to maximize the reuse of reticles (use the same masks), one may select the interface layer to be at the local interconnect level (Localint). On the other hand, if one desires more flexibility in a block design (typically cells involved, at least Metal 1), one may select the interface layer to be at the Vial level. It is understood that within the 21 metal stack structures of the G12™ process design rules, Localint is a layer at the bottom and Vial is a layer between Metal 1 and Metal 2.

Then, a set of compatible blocks between different base wafer processes (a base wafer process is the forgoing described prefabrication step or diffusion step of a foundry process) may be created 606. These compatible blocks may include I/O cells, SRAM, sea-of-transistors, IP blocks, standard cells that may be used to develop additional IP blocks, and the like. The compatible blocks may be created as follows. First, one may assume there exist process layers L1 through Ln and a base wafer/metal stack interface layer Lm, Lm being a layer between L1 and Ln. Thus, process layers L1 through L(m−1) are base wafer layers, and process layers Lm through Ln are metal stack layers. It is understood that an interface layer is not a base wafer layer, but a metal stack layer. One may further assume that there is a single metal stack and two base wafer processes A and B. Thus, the base wafer layers for process A ($L1_A$ through $L(m-1)_A$) are different from the base wafer layers for process B ($L1_B$ through $L(m-1)_B$). However, the metal stack layers Lm through Ln are the same for processes A and B. Then, a composite layout compacting problem for a block may be constructed for base wafer layers $L1_A$ through $L(m-1)_A$, base wafer layers $L1_B$ through $L(m-1)_B$, and metal stack layers Lm through Ln. Thus, objects in base wafer layers $L1_A$ through $L(m-1)_A$ have constraints with one another and with objects in metal stack layers Lm through Ln, and objects in base wafer layers $L1_B$ through $L(m-1)_B$ have constraints with each other and with objects in metal stack layers Lm through Ln. It is understood that compaction means minimizing the "X" dimension, the "Y" dimension, or both dimensions simultaneously within the constraints of the design rules. It is also understood that the above described procedure for creating compatible blocks (CCB procedure) may be extended from optimizing area (layout compaction) to optimizing performance and yield in the context of targeting multiple processes without departing from the scope and spirit of the present invention.

Next, a physical design library may be created 608. The physical design library may capture the design rule constraints and make them available to tools for physical design. Then, a logic design and timing library may be created 610. The logic design and timing library may be created by first characterizing the blocks in all of the processes and then applying guard bands to select a yield versus performance tradeoff at a system design level.

Figure 7:
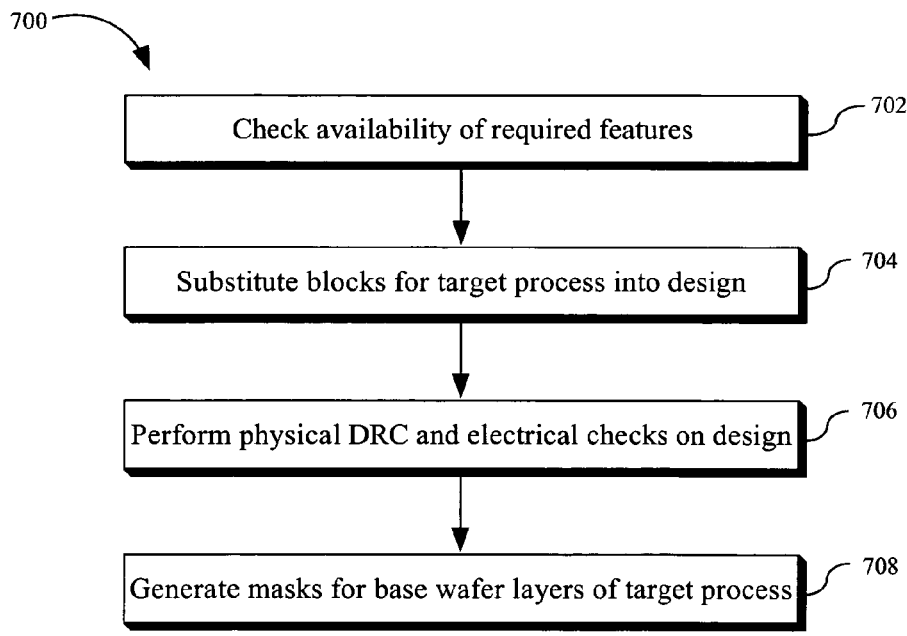
FIG. 7 is a flow diagram showing an exemplary method for platform porting in accordance with the present invention.

Referring now to FIG. 7, a flow diagram showing an exemplary method or process 700 for platform porting in accordance with the present invention is shown. The process 700 may start with a step 702 in which availability of required features is checked 700. In a preferred embodiment, the step 702 is the same as the step 602 shown in FIG. 6. Blocks for a target process may be substituted into the design 704. Physical DRC (design rule check) and electrical (e.g., timing, IR drop, and the like) checks may be performed on the design 706. Masks for base wafer layers of the target process may be generated 708. This is based on the assumption that the metal stack layers are the same for foundry processes.

It is understood that computer resources that may be used to accomplish the present invention may include 32-bit or 64-bit hardware, the 32-bit or 64-bit Linux operating system, the 64-bit Solaris operating system on SPARC, and the like.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a storage medium including stored computer code which is used to program a computer to perform the disclosed function and process of the present invention. The storage medium may include, but is not limited to, any type of conventional floppy disks, optical disks, CD-ROMS, magneto-optical disks, ROMs, RAMs, EPROMs, EEPROMs, magnetic or optical cards, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for mapping platform-based design to multiple foundry processes, comprising steps of:
   (a) defining a virtual process to include at least one fabrication process;
   (b) storing, into a database, said virtual process in a representation including a list of attributes of entities making up said at least one fabrication process; and
   (c) performing optimization of the database using mathematical and statistical tools, wherein said step (c) comprising:
   (c1) using a first system of linear equalities and linear inequalities to describe operational characteristics and interactions of circuit elements;
   (c2) evaluating, said first system as a linear programming problem;
   (c3) using a second system of linear equalities, at least one of linear inequalities and convex inequalities, and a linear or convex objective function to describe said operational characteristics and interactions of circuit elements; and
   (c4) evaluating said second system as a convex optimization problem.

2. The method of claim 1, wherein said operational characteristics include timing characteristics.

3. The method of claim 1, wherein said step (c2) is performed using at least one of the simplex method, Khachian's algorithm, and Karmarkar's algorithm.

4. The method of claim 1, wherein said step (c2) or said step (c4) is performed using convex optimization.

5. The method of claim 4, wherein said convex optimization uses at least one of Levin's algorithm, the Nemirovsky-Yudin-Shor method, a descent method, a barrier method, and a cutting-plane method.

6. The method of claim 4, wherein when said first system of linear equalities and linear inequalities as a totality is not a convex problem, decomposing said first system of linear equalities and linear inequalities to include a combination of convex sub-problems.

7. The method of claim 4, wherein when said first system or said second system appears in a non-convex form, recasting said first system or said second system in a convex form by problem decomposition or a change of variables to convert a non-convex problem or sub-problem into a convex problem or sub-problem.

8. A method for mapping platform-based design to multiple foundry processes, comprising steps of:
   defining a virtual process to include at least one fabrication process:
   storing, into a database, said virtual process in a representation including a list of attributes of entities making up said at least one fabrication process;
   performing optimization of the database using mathematical and statistical tools; and
   finding properties of an optimal process for manufacturing at least one slice.

9. The method of claim 8, wherein said optimal process is amenable to accommodating an extension of said at least one slice in a particular direction.

10. A method for mapping platform-based design to multiple foundry processes, comprising steps of:
    defining a virtual process to include at least one fabrication process;
    storing, into a database, said virtual process in a representation including a list of attributes of entities making up said at least one fabrication process;

performing optimization of the database using mathematical and statistical tools; and running design properties for at least one slice into said database to allow various levels of comparison to take place between a slice space and a process space.

11. An apparatus for mapping platform-based design to multiple foundry processes, comprising:
(a) means for defining a virtual process to include at least one fabrication process;
(b) means for storing, into a database, said virtual process in a representation including a list of attributes of entities making up said at least one fabrication process; and
(c) means for performing optimization of the database using mathematical and statistical tools, wherein said means (c) comprising:
(c1) means for using a first system of linear equalities and linear inequalities to describe operational characteristics and interactions of circuit elements;
(c2) means for evaluating said first system as a linear programming problem;
(c3) means for using a second system of linear equalities, at least one of linear inequalities and convex inequalities, and a linear or convex objective function to describe said operational characteristics and interactions of circuit elements; and
(c4) means for evaluating said second system as a convex optimization problem.

12. The apparatus of claim 11, wherein said operational characteristics include timing characteristics.

13. The apparatus of claim 11, wherein said means (c2) uses at least one of the simplex method, Khachian's algorithm, and Karmarkar's algorithm to solve said linear programming problem.

14. The apparatus of claim 11, wherein said means (c2) or said means (c4) uses convex optimization to solve said linear programming problem or said convex optimization problem.

15. The apparatus of claim 14, wherein said convex optimization uses at least one of Levin's algorithm, the Nemirovsky-Yudin-Shor method, a descent method, a barrier method, and a cutting-plane method.

16. The apparatus of claim 14, further comprising when said first system of linear equalities and linear inequalities as a totality is not a convex problem, means for decomposing said first system of linear equalities and linear inequalities to include a combination of convex sub-problems.

17. The apparatus of claim 14, further comprising when said first system or said second system appears in a non-convex form, means for recasting said first system or said second system in a convex form by problem decomposition or a change of variables to convert a non-convex problem or sub-problem into a convex problem or sub-problem.

18. An apparatus for mapping platform-based design to multiple foundry processes, comprising:
means for defining a virtual process to include at least one fabrication process;
means for storing, into a database, said virtual process in a representation including a list of attributes of entities making up said at least one fabrication process;
means for performing optimization of the database using mathematical and statistical tools; and
means for finding properties of an optimal process for manufacturing at least one slice.

19. An apparatus for mapping platform-based design to multiple foundry processes, comprising:

means for defining a virtual process to include at least one fabrication process;
means for storing, into a database, said virtual process in a representation including a list of attributes of entities making up said at least one fabrication process; and
means for performing optimization of the database using mathematical and statistical tools,
wherein said optimal process is amenable to accommodating an extension of said at least one slice in a particular direction.

20. An apparatus for mapping platform-based design to multiple foundry processes, comprising:
means for defining a virtual process to include at least one fabrication process;
means for storing, into a database, said virtual process in a representation including a list of attributes of entities making up said at least one fabrication process;
means for performing optimization of the database using mathematical and statistical tools; and
means for running design properties for at least one slice into said database to allow various levels of comparison to take place between a slice space and a process space.

21. A computer-readable medium having computer-executable instructions for performing a method for mapping platform-based design to multiple foundry processes, said method comprising steps of:
(a) defining a virtual process to include at least one fabrication process;
(b) storing, into a database, said virtual process in a representation including a list of attributes of entities making up said at least one fabrication process; and
(c) performing optimization of the database using mathematical and statistical tools, wherein said step (c) comprising:
(c1) using a first system of linear equalities and linear inequalities to describe operational characteristics and interactions of circuit elements;
(c2) evaluating said first system as a linear programming problem;
(c3) using a second system of linear equalities, at least one of linear inequalities and convex inequalities, and a linear or convex objective function to describe said operational characteristics and interactions of circuit elements; and
(c4) evaluating said second system as a convex optimization problem.

22. The computer-readable medium of claim 21, wherein said operational characteristics include timing characteristics.

23. The computer-readable medium of claim 21, wherein said step (c2) is performed using at least one of the simplex method, Khachian's algorithm, and Karmarkar's algorithm.

24. The computer-readable medium of claim 21, wherein said step (c2) or said step (c4) is performed using convex optimization.

25. The computer-readable medium of claim 24, wherein said convex optimization uses at least one of Levin's algorithm, the Nemirovsky-Yudin-Shor method, a descent method, a barrier method, and a cutting-plane method.

26. The computer-readable medium of claim 24, wherein said method further comprising when said first system of linear equalities and linear inequalities as a totality is not a convex problem, decomposing said first system of linear equalities and linear inequalities to include a combination of convex sub-problems.

27. The computer-readable medium of claim 24, wherein said method further comprising when said first system or said second system appears in a non-convex form, recasting said first system or said second system in a convex form by problem decomposition or a change of variables to convert a non-convex problem or sub-problem into a convex problem or sub-problem.

28. A computer-readable medium having computer-executable instructions for performing a method for mapping platform-based design to multiple foundry processes, said method comprising steps of:
   defining a virtual process to include at least one fabrication process;
   storing, into a database, said virtual process in a representation including a list of attributes of entities making up said at least one fabrication process;
   performing optimization of the database using mathematical and statistical tools; and
   finding properties of an optimal process for manufacturing at least one slice.

29. The computer-readable medium of claim 28, wherein said optimal process is amenable to accommodating an extension of said at least one slice in a particular direction.

30. A computer-readable medium having computer-executable instructions for performing a method for mapping platform-based design to multiple foundry processes, said method comprising steps of:
   defining a virtual process to include at least one fabrication process;
   storing, into a database, said virtual process in a representation including a list of attributes of entities making up said at least one fabrication process;
   performing optimization of the database using mathematical and statistical tools; and
   running design properties for at least one slice into said database to allow various levels of comparison to take place between a slice space and a process space.

31. A method for mapping platform-based design to multiple foundry processes, comprising steps of:
   optimizing a first slice to a first foundry process including a first late metal step; and
   optimizing a second slice to a second foundry process including a second late metal step,
   wherein said first late metal step and said second late metal step share a functional, geometrical and electrical interface so that said first slice, after being implemented in said first foundry process, may be readily implemented in said second foundry process for metallization, and said second slice, after being implemented in said second foundry process, may be readily implemented in said first foundry process for metallization.

* * * * *